(12) United States Patent
Zhu et al.

(10) Patent No.: US 11,753,422 B2
(45) Date of Patent: Sep. 12, 2023

(54) METHODS FOR STABILIZING PEROVSKITES

(71) Applicants: ALLIANCE FOR SUSTAINABLE ENERGY, LLC, Golden, CO (US); BOARD OF TRUSTEES OF NORTHERN ILLINOIS UNIVERSITY, DeKalb, IL (US)

(72) Inventors: Kai Zhu, Littleton, CO (US); Jinhui Tong, Lakewood, CO (US); Tao Xu, Naperville, IL (US); Xun Li, DeKalb, IL (US)

(73) Assignees: Alliance for Sustainable Energy, LLC, Golden, CO (US); Board of Trustees of Northern Illinois University, DeKalb, IL (US)

(*) Notice: Subject to any disclaimer, the term of this patent is extended or adjusted under 35 U.S.C. 154(b) by 8 days.

(21) Appl. No.: 17/406,275

(22) Filed: Aug. 19, 2021

(65) Prior Publication Data
US 2022/0059780 A1  Feb. 24, 2022

Related U.S. Application Data

(60) Provisional application No. 63/067,384, filed on Aug. 19, 2020.

(51) Int. Cl.
*C07F 7/24* (2006.01)
*H01G 9/20* (2006.01)
(Continued)

(52) U.S. Cl.
CPC .......... *C07F 7/24* (2013.01); *C01B 4/00* (2013.01); *C07F 7/22* (2013.01); *H01G 9/0036* (2013.01); *H01G 9/2009* (2013.01); *H10K 30/20* (2023.02); *H10K 30/30* (2023.02); *H10K 71/12* (2023.02); *H10K 85/30* (2023.02); *C01P 2002/34* (2013.01); *Y02E 10/542* (2013.01); *Y02E 10/549* (2013.01)

(58) Field of Classification Search
None
See application file for complete search history.

(56) References Cited

U.S. PATENT DOCUMENTS

2018/0204684 A1* 7/2018 Park .................... H01L 51/0077

FOREIGN PATENT DOCUMENTS

WO  WO-2018026326 A1 *  2/2018 ............. C30B 29/54

OTHER PUBLICATIONS

Bakulin, A. et al., "Real-Time Observation of Organic Cation Reorientation in Methylammonium Lead Iodide Perovskites," Journal of Physical Chemistry Letters, vol. 6, 2015, 7 pages.
(Continued)

*Primary Examiner* — Katie L. Hammer
(74) *Attorney, Agent, or Firm* — Michael A. McIntyre

(57) ABSTRACT

The present disclosure relates to a composition that includes a material of at least one of a perovskite structure, a perovskite-like structure, and/or a perovskitoid structure, where the material includes an isotope of an element, the isotope has more neutrons than protons, and the isotope is incorporated into the perovskite structure, the perovskite-like structure, and/or the perovskitoid structure. In some embodiments of the present disclosure, the isotope may make up between greater than 0% and 100% of the element.

12 Claims, 13 Drawing Sheets

(51) Int. Cl.
　　　H01G 9/00　　　(2006.01)
　　　C07F 7/22　　　(2006.01)
　　　C01B 4/00　　　(2006.01)
　　　H10K 85/30　　(2023.01)
　　　H10K 30/20　　(2023.01)
　　　H10K 30/30　　(2023.01)
　　　H10K 71/12　　(2023.01)

(56)　　　　　　　　References Cited

OTHER PUBLICATIONS

Chen, B. et al., "Imperfections and their passivation in halide perovskite solar cells," RSC Chem Soc Rev, vol. 48, 2019, 26 pages.
Dunfield, S. et al., "From Defects to Degradation: A Mechanistic Understanding of Degradation in Perovskite Solar Cell Devices and Modules," Advanced Energy Materials, vol. 10, 2020, 35 pages.
Fu, Y. et al., "Stabilization of the Metastable Lead Iodide Perovskite Phase via Surface Functionalization," ACS Nano Letters, vol. 17, 2017, 10 pages.
Gong, J. et al., "Electron-Rotor Interaction in Organic-Inorganic Lead Iodide Perovskites Discovered by Isotope Effects," Journal of Physical Chemistry Letters, vol. 7, 2016, 9 pages.
Jones, W., "Isotope Effects in C—H Bond Activation Reactions by Transition Metals," Accounts of Chemical Research, vol. 36, No. 2, 2003, 7 pages.
Jung, E.H. et al., "Efficient, stable and scalable perovskite solar cells using poly(3-hexylthiophene)," Nature Letter, vol. 567, Mar. 28, 2019, 19 pages.
Liu, Y. et al., "Ultrahydrophobic 3D/2D fluoroarene bilayer-based water-resistant perovskite solar cells with efficiencies exceeding 22%," Science Advances, vol. 5, 2019, 9 pages.
Liu, Y. et al., "Stabilization of Highly Efficient and Stable Phase-Pure FAPbI3 Perovskite Solar Cells by Molecularly Tailored 2D-Overlayers," Angewandte Chem. International Edition, vol. 59, 2020, 7 pages.
Lozada-Hidalgo, M. et al., "Scalable and efficient separation of hydrogen isotopes using graphene-based electrochemical pumping," Nature Communications, 2017, 5 pages.
Miller, A., "Heavy Water: A Manufacturers' Guide for they Hydrogen Century," Canadian Nuclear Society Bulletin, vol. 22, No. 1, Feb. 2001, 14 pages.
Reid, J.P. et al., "Competition between N—H and N—D Bond Cleavage in the Photodissociation of NH2D and ND2H," Journal of Phys. Chem. A, vol. 104, 2000, 11 pages.
Solanki, A. et al., "Heavy Water Additive in Formamidinium: A Novel Approach to Enhance Perovskite Solar Cell Efficiency," Advanced Materials, vol. 32, 2020, 11 pages.
Svane, K.L. et al., "How Strong Is the Hydrogen Bond in Hybrid Perovskites?", Journal of Physical Chemistry Letters, vol. 8, 2017, 6 pages.
Wang, R. et al., "A Review of Perovskites Solar Cell Stability," Advanced Functional Materials, vol. 29, 2019, 25 pages.
Wilson, R.E., "Structure, Phase Transitions, and Isotope Effects in [(CH3)4N]2PuCl6," Inorganic Chemistry, vol. 54, 2015, 6 pages.
Yang, S. et al., "Stabilizing halide perovskite surfaces for solar cell operation with wide-bandgap lead oxysalts," Science, vol. 365, Aug. 2, 2019, 7 pages.

\* cited by examiner

METHODS FOR STABILIZING PEROVSKITES

CROSS-REFERENCE TO RELATED APPLICATIONS

This application claims priority from U.S. Provisional Patent Application No. 63/067,384 filed on Aug. 19, 2020, the contents of which are incorporated herein by reference in their entirety.

CONTRACTUAL ORIGIN

This invention was made with government support under Contract No. DE-AC36-08GO28308 awarded by the Department of Energy. This invention was made with government support under Contract No. DMR-1806152 awarded by the National Science Foundation. The government has certain rights in the invention.

BACKGROUND

Emerging perovskite solar cells-(PSCs) have high power conversion efficiencies (PCE) and the potential for a low levelized cost of electricity of $0.02/kWh by 2030. However, the market adoption of PSCs still faces major challenges, including the instability in long-term PCE. Thus, there remains a need for the further development of new and innovative ideas for improving the stability of PSCs to accelerate their development and ultimately their commercialization in industry and implementation in the marketplace.

SUMMARY

An aspect of the present disclosure is a composition that includes a material of at least one of a perovskite structure, a perovskite-like structure, and/or a perovskitoid structure, where the material includes an isotope of an element, the isotope has more neutrons than protons, and the isotope is incorporated into the perovskite structure, the perovskite-like structure, and/or the perovskitoid structure. In some embodiments of the present disclosure, the isotope may make up between greater than 0% and 100% of the element.

In some embodiments of the present disclosure, the isotope may have been added to the composition by a non-natural means. In some embodiments of the present disclosure, the isotope includes at least one of hydrogen, carbon, and/or nitrogen. In some embodiments of the present disclosure, the isotope may include at least one of deuterium, carbon-13, and/or nitrogen-15. In some embodiments of the present disclosure, the material may have a stoichiometry comprising at least one of $ABX_3$, $A_2BX_6$, $A_2BX_4$, $ABX_4$, and/or $A_3B_2X_9$, where A is a first cation, B is a second cation, and X is an anion, and the first cation includes the isotope.

In some embodiments of the present disclosure, the first cation may include at least one of methylammonium (MA), formamidinium (FA), ethylammonium, propylammonium, butylammonium, hydrazinium, acetylammonium, dimethylammonium, imidazolium, guanidinium, benzylammonium, and/or phenethylammonium. In some embodiments of the present disclosure, the first cation may include at least one of FA and/or MA, the second cation may include at least one of lead and/or tin, and the anion may include a halide. In some embodiments of the present disclosure, the perovskite may further include an inorganic A-cation. In some embodiments of the present disclosure, the inorganic A-cation may include cesium. In some embodiments of the present disclosure, the stoichiometry may include $Cs_{(1-x-y)}FA_xMA_yPb_{(1-a)}Sn_aI_{(3-z)}Br_z$. In some embodiments of the present disclosure, the stoichiometry may include at least one of $Cs_{0.05}FA_{0.8}MA_{0.15}PbI_{2.55}Br_{0.45}$, $Cs_{0.25}FA_{0.75}Sn_{0.5}Pb_{0.5}I_3$, or $FA_{0.6}MA_{0.4}Pb_{0.4}Sn_{0.6}I_3$.

An aspect of the present disclosure is an optoelectronic device that includes a material having at least one of a perovskite structure, a perovskite-like structure, and/or a perovskitoid structure, where the material includes an isotope of an element, the isotope has more neutrons than protons, and the isotope is incorporated into the perovskite structure, the perovskite-like structure, and/or the perovskitoid structure.

An aspect of the present disclosure is a method that includes synthesizing a precursor having an isotope, preparing a solution that includes the precursor, depositing the solution onto a surface to form a film of the solution on the substrate, and treating the film, where the treating converts the film to a material that includes at least one of a perovskite structure, a perovskite-like structure, or a perovskitoid structure, the material comprises an isotope of an element, the isotope has more neutrons than protons, and the isotope is incorporated into the perovskite structure, the perovskite-like structure, and/or the perovskitoid structure.

BRIEF DESCRIPTION OF THE DRAWINGS

Some embodiments are illustrated in referenced figures of the drawings. It is intended that the embodiments and figures disclosed herein are to be considered illustrative rather than limiting.

Figure 1A:
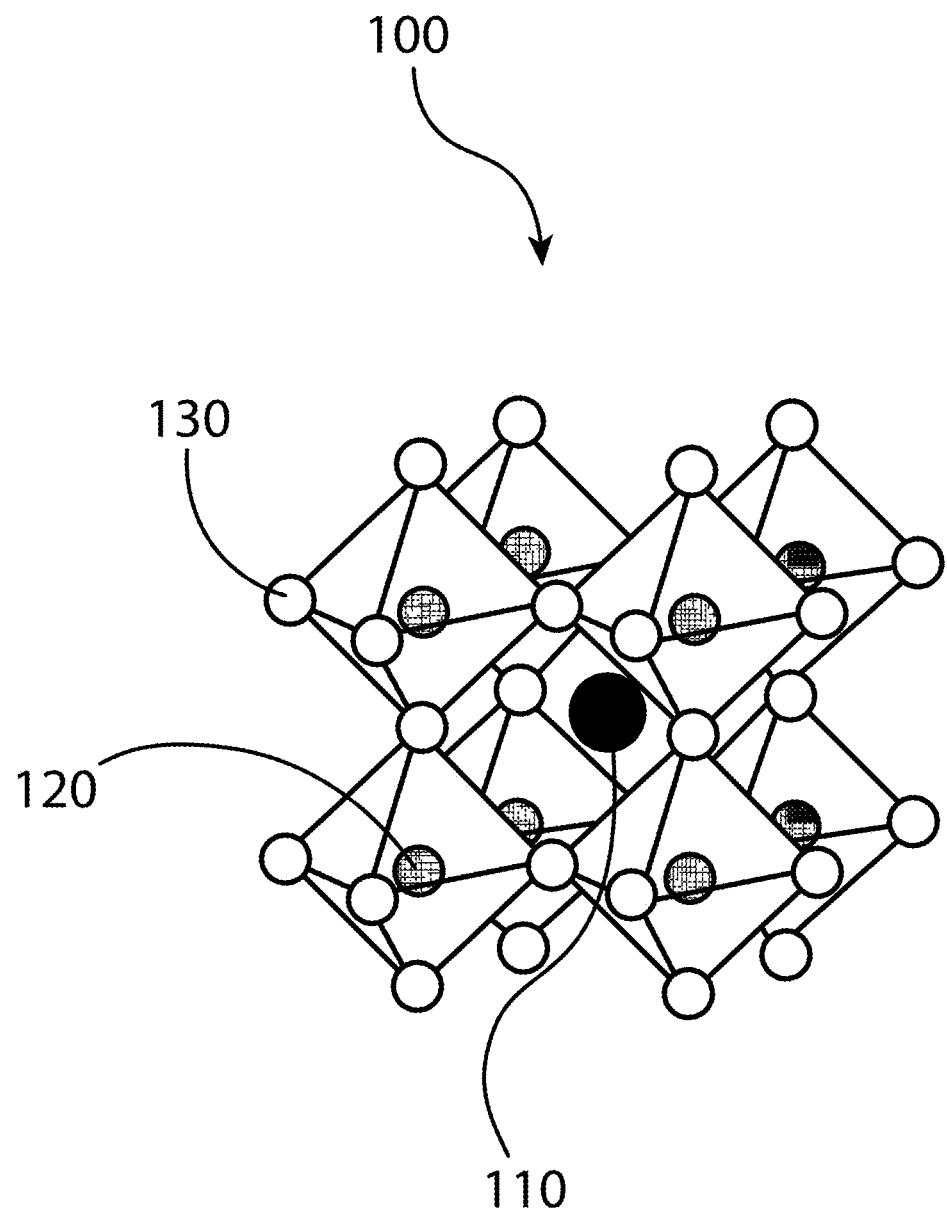
FIGS. 1A and 1B illustrate a perovskite in a corner-sharing, cubic phase arrangement, according to some embodiments of the present disclosure.

REFERENCE NUMBERS 100 perovskite
110 A-cation
120 B-cation
130 X-anion

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to methods that, among other things, increase the stability of perovskites, especially at elevated operating temperatures, by modifying the perovskite compositions. Although the present disclosure focuses on perovskites, the methods described herein are also applicable to other materials such as organic semiconductors and/or organic photovoltaic materials. One key factor relating to the instability of perovskites is the motion (e.g., translation, rotation, and/or vibration) of the atoms in their constituent molecular cations in the perovskite lattice caused by electrical potential, solar irradiation, thermal heating, their vulnerability to moisture and/or oxygen, and/or other stress factors. Fundamentally, the weak Pb—I-bond-energy (1.47-eV) and $A^+ \ldots BX^{3-}$ cage interaction (between about 0.3 eV and 1.4 eV) assure PSCs of superior photovoltaic (PV) performance. However, this also results in structural weakness significantly lower than the bond energy of an Si—Si bond (2.3 eV), which results in the high stability of a Si PV device.

In some embodiments of the present disclosure, the motion of $A^+$ site cations (e.g., formamidinium ($FA^+$) and methylammonium ($MA^+$)) may be suppressed by increasing their nuclear masses using non-radioactive and low-cost heavier isotopes. For example, the hydrogen atoms in $FA^+$ or $MA^+$ may be partially replaced and/or fully replaced by their deuterated counterparts. A full deuteration of all active H atoms in N—H bonds in FA+, $D_2NCH=ND_2^+$, increases the mass of the non-deuterated $FA^+$ by ~9%. A full deuteration of MA+, $CD_3ND_3^+$, increases the mass of the non-deuterated $MA^+$ by ~19%. In addition to hydrogen, in some embodiments of the present disclosure, methods and compositions may utilize stable isotopes of carbon and nitrogen, such as C-13, N-15.

As defined herein, formamidinium may be represented by either $H_2NCH=NH_2^+$ or $[H_2N^-—CH^-—NH_2]^+$ where the second representation more accurately describes the double bond's resonance structure between both sides of the carbon and nitrogen atoms; e.g., both $H_2N—CH=NH_2^+$ and $H_2N=CH—NH_2^+$ are present equally statistically. As defined herein, an A-cation may be represented as $A^+$ or $[A]^+$, where the brackets are used to simply indicate that the charge is on the entire polyatomic ion, not on a particular side or portion of the ion. For example, both $[CH_3NH_3]^+$ and $CH_3NH_3^+$, as defined herein, represent methylammonium.

Thus, in some embodiments of the present disclosure, a method may utilize at least one of deuterated hydrogen (D), C-13, and/or N-15 to construct heavier organic cations that, for a given set of conditions, demonstrate reduced translational, rotational, and vibrational motion. The A-site cations, particularly the organic cations, are species vulnerable to motion and account for at least a portion of the instability of PSCs because they are polyatomic cations composed of light elements (e.g., C, H, N) having high degrees of freedom. For instance, $MA^+$ rotates at a period between about 0.3 ps and about 3 ps. According to quantum mechanics, all the translational, rotational, and vibrational energy levels are inversely related to the mass. Therefore, deuteration of an organic cation increases the mass and moment of inertia of this charged molecular rotor and results in at least two major effects: slowed diffusion of $A^+$ ions, and reduced phonon frequencies from the $PbI_3$-lattice. The latter helps to increase the heat capacity as well to stabilize the structure, which makes the structure more inert under solar irradiation. In addition, the oxidative cleavage kinetics for the C—H bond can be more than 4-fold faster than for the C-D bond, and a significantly slowed photo-dissociation of N-D bond than N—H bond, both providing a potentially more oxygen-inert and photostable deuterated organic cation compared to the non-deuterated organic cations.

Figure 1B:
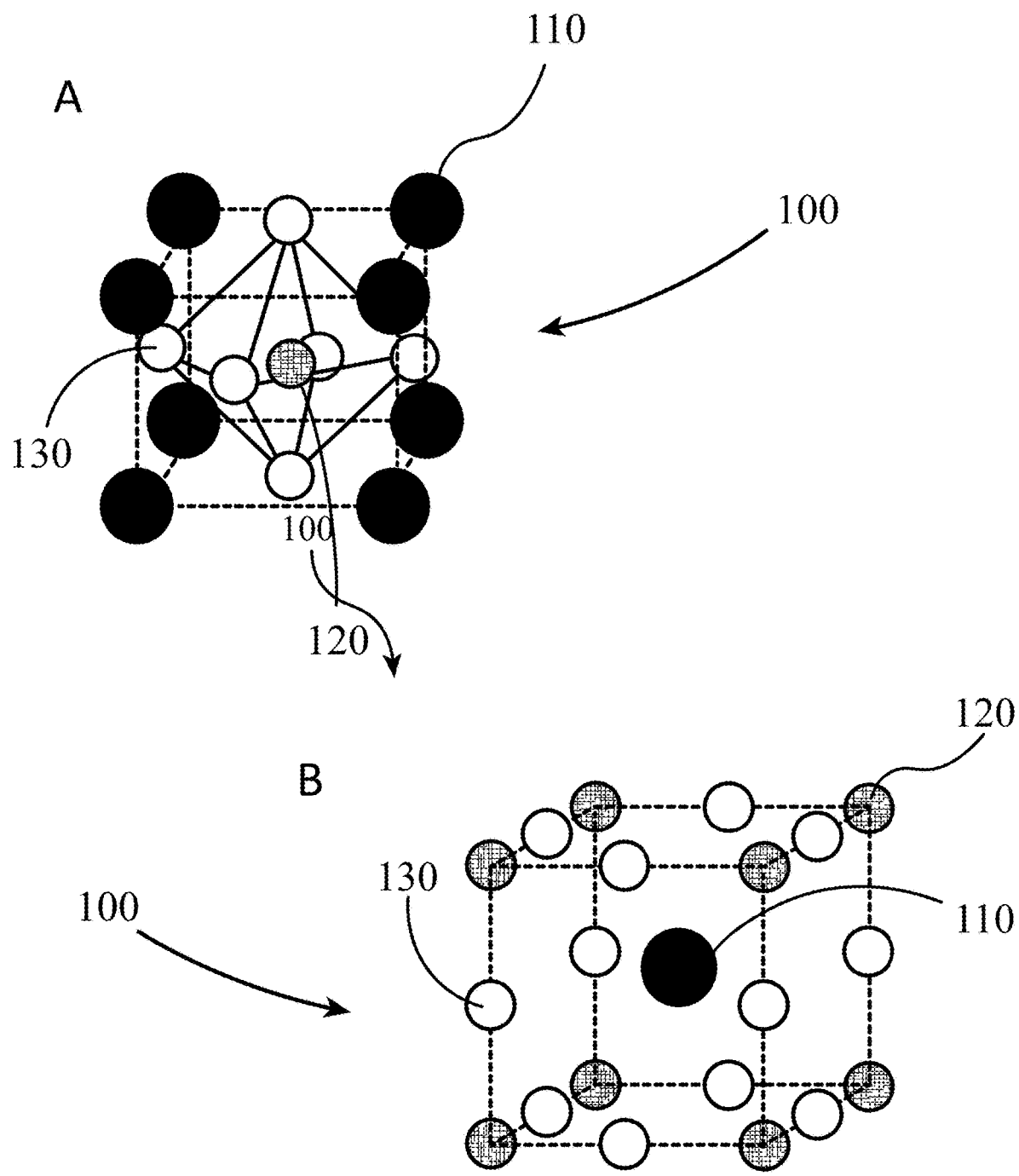

As defined herein, the term "perovskite" refers to compositions having a network of corner-sharing $BX_6$ octahedra resulting in the general stoichiometry of $ABX_3$. FIGS. 1A and 1B illustrate that perovskites 100, for example metal halide perovskites, may organize into a three-dimensional (3D) cubic crystalline structures (i.e., α-phase or α-$ABX_3$) constructed of a plurality of corner-sharing $BX_6$ octahedra. In the general stoichiometry for a perovskite, $ABX_3$, X (130) is an anion and A (110) and B (120) are cations, typically of different sizes. FIG. 1A illustrates that a perovskite 100 having an α-phase structure may be further characterized by eight $BX_6$ octahedra surrounding a central A-cation 110, where each octahedra is formed by six X-anions 130 surrounding a central B-cation 120 and each of the octahedra are linked together by "corner-sharing" of anions, X (130).

Panel A of FIG. 1B provides another visualization of a perovskite 100 in the α-phase, also referred to as the cubic phase. This is because, as shown in FIG. 1B, a perovskite in the α-phase may be visualized as a cubic unit cell, where the B-cation 120 is positioned at the center of the cube, an A-cation 110 is positioned at each corner of the cube, and an X-anion 130 is face-centered on each face of the cube. Panel B of FIG. 1B provides another visualization of the cubic unit cell of an α-phase perovskite, where the B-cation 120 resides at the eight corners of a cube, while the A-cation 110 is located at the center of the cube and with 12 X-anions 130 centrally located between B-cations 120 along each edge of the unit cell. For both unit cells illustrated in FIG. 1B, the A-cations 110, the B-cations 120, and the X-anions 130 balance to the general formula $ABX_3$ of a perovskite, after accounting for the fractions of each atom shared with neighboring unit cells. For example, referring to Panel A of FIG. 1B, the single B-cation 120 atom is not shared with any of the neighboring unit cells. However, each of the six X-anions 130 is shared between two unit cells, and each of the eight A-cations 110 is shared between eight unit cells. So, for the unit cell shown in Panel A of FIG. 1B, the stoichiometry simplifies to B=1, A=8*0.125=1, and X=6*0.5=3, or $ABX_3$. Similarly, referring again to Panel B of FIG. 1B, since the A-cation is centrally positioned, it is not shared with any of the unit cells neighbors. However, each of the 12 X-anions 130 is shared between four neighboring unit cells, and each of the eight B-cations 120 is shared between eight neighboring unit cells, resulting in A=1, B=8*0.125=1, and X=12*0.25=3, or $ABX_3$. Referring again to Panel B of FIG. 1B, the X-anions 130 and the B-cations 120 of a perovskite in the α-phase are aligned along an axis; e.g., where the angle at the X-anion 130 between two neighboring B-cations 120 is exactly 180 degrees, referred to herein as the tilt angle. However, as shown in FIG. 2A, a perovskite 100 may assume other corner-sharing crystalline phases having tilt angles not equal to 180 degrees.

Figure 2A:
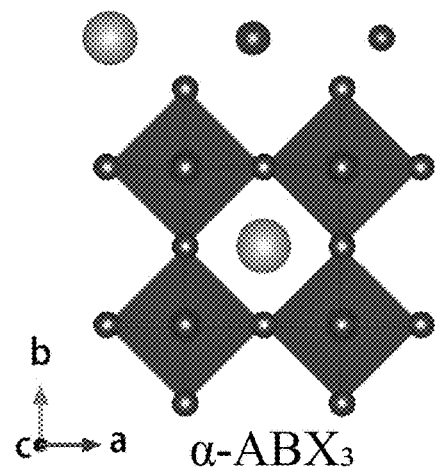
FIG. 2A illustrates three possible corner-sharing phases for perovskites, Panel (a) cubic phase (i.e., $\alpha$-$ABX_3$), Panel (b) a tetragonal crystalline phase (i.e., $\beta$-$ABX_3$), and Panel (c) an orthorhombic crystalline phase (i.e., $\gamma$-$ABX_3$), according to some embodiments of the present disclosure.
Figure 2A:
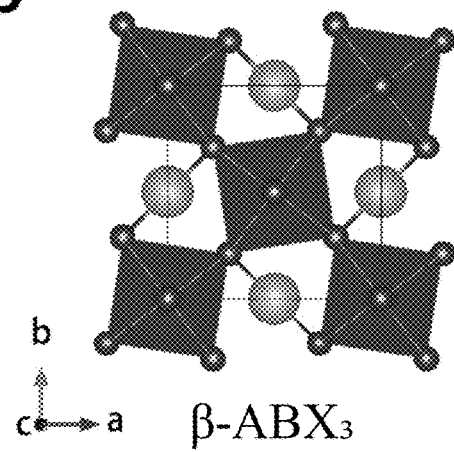
Figure 2A:
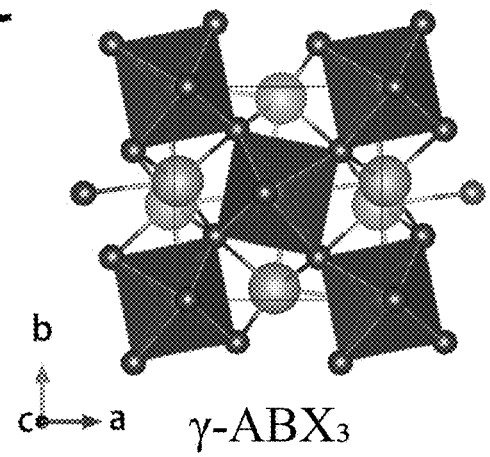

FIG. 2A illustrates that a perovskite can assume other crystalline forms while still maintaining the criteria of an $ABX_3$ stoichiometry with neighboring $BX_6$ octahedra maintaining X anion (130) corner-sharing. Thus, in addition to α-$ABX_3$ perovskites (in the cubic phase) having a tilt angle of 180 degrees, shown in Panel (a) of FIG. 2A, a perovskite may also assume a tetragonal crystalline phase (i.e., β-$ABX_3$) (see Panel (b) of FIG. 2A) and/or an orthorhombic crystalline phase (i.e., γ-$ABX_3$) (see Panel (c) of FIG. 2A), where the adjacent octahedra are tilted relative to the reference axes a, b, and c.

Figure 2B:
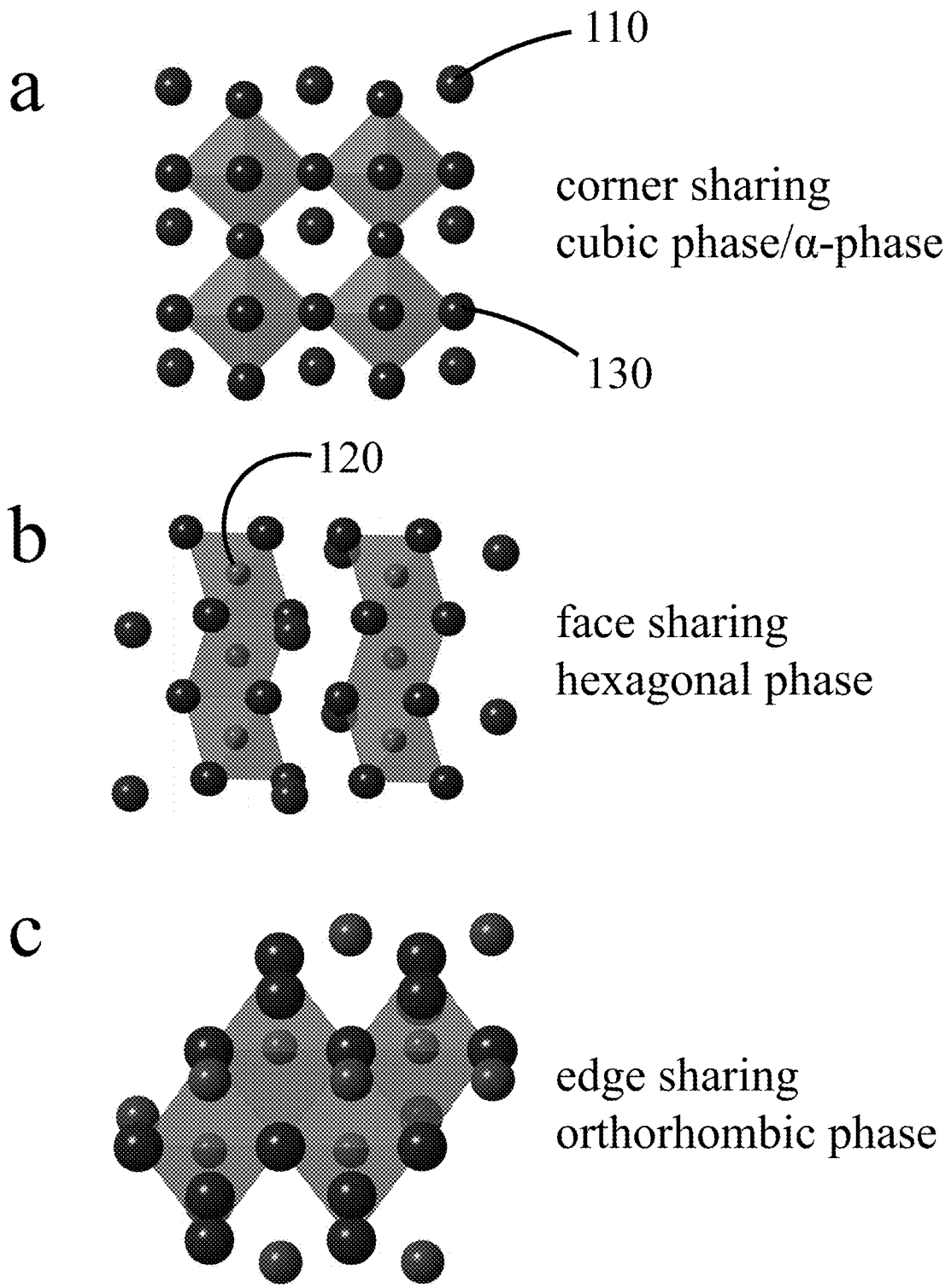
FIG. 2B illustrates a perovskite in one of the three possible phases, the cubic phase (i.e., $\alpha$-phase), compared to two non-perovskite phases (i.e., non-corner sharing), according to some embodiments of the present disclosure.

FIG. 2B illustrates that the elements used to construct a perovskite, as described above, A-cations 110, B-cations 120, and X-anions 130, may result in 3D non-perovskite structures; i.e., structures where neighboring $BX_6$ octahedra are not X-anion 130 corner-sharing and/or do not have a unit structure that simplifies to the $ABX_3$ stoichiometry. Referring to FIG. 2B, Panel (a) illustrates a perovskite in the cubic phase, i.e., α-$ABX_3$, compared to a non-perovskite structure constructed of face-sharing $BX_6$ octahedra resulting in a hexagonal crystalline structure (see Panel (b) of FIG. 2B) and a non-perovskite structure constructed of edge-sharing $BX_6$ octahedra resulting in an orthorhombic crystalline structure (see Panel (c) of FIG. 2B).

Figure 3:
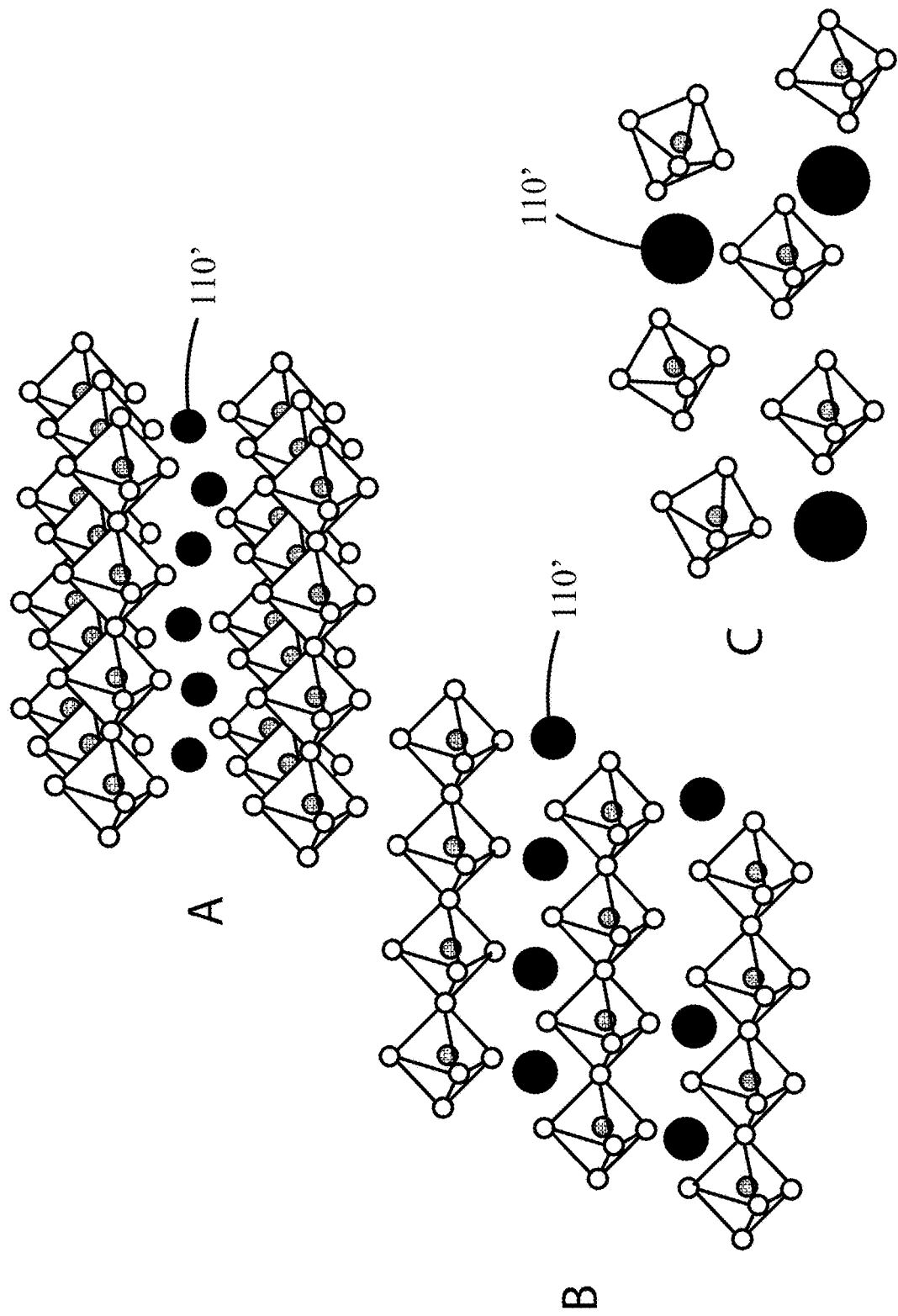
FIG. 3 illustrates 2D, 1D, and 0D perovskite-like structures, in Panels A, B, and C, respectively, according to some embodiments of the present disclosure.

Further, referring now to FIG. 3, the elements used to construct a perovskite, as described above, A-cations 110, B-cations 120, and X-anions 130, may result in non-3D (i.e., lower dimensional structures) perovskite-like structures such as two-dimensional (2D) structures, one-dimensional (1D) structures, and/or zero-dimensional (0D) structures. As shown in FIG. 3, such lower dimensional, perovskite-like structures still include the $BX_6$ octahedra, and depending on the dimensionality, e.g., 2D or 1D, may still maintain a degree of X-anion corner-sharing. However, as shown in FIG. 3, the X-anion 130 corner-sharing connectivity of neighboring octahedra of such lower dimensional structures, i.e., 2D, 1D, and 0D, is disrupted by intervening A-cations 110. Such a disruption of the neighboring octahedra, can be achieved by, among other things, varying the size of the intervening A-cations 110.

Referring to Panel A of FIG. 3, a 3D perovskite may be transformed to a 2D perovskite-like structure, 1D perovskite-like structure, and/or 0D perovskite-like structure. Where the degree of X-anion 130 corner sharing decreases and the stoichiometry changes according to the formula $(A')_m(A)_{n-1}BnX_{3n+1}$, where monovalent (m=2) or divalent (m=1) A' cations 110' can intercalate between the X-anions of 2D perovskite-like sheets. Referring to Panel B of FIG. 3, 1D perovskite-like structures are constructed by $BX_6$ octahedral chained segments spatially isolated from each other by surrounding bulky organic A'-cations 110', leading to bulk assemblies of paralleled octahedral chains. Referring to Panel C of FIG. 3, typically, the 0D perovskite-like structures are constructed of isolated inorganic octahedral clusters and surrounded by small A'-cations 110', which may be connected via hydrogen bonding. In general, as n approaches infinity the structure is a pure 3D perovskite and when n is equal to 1, the structure is a pure 2D perovskite-like structure. More specifically, when n is greater than 10 the structure is considered to be essentially a 3D perovskite material and when n is between 1 and 5, inclusively, the structure is considered substantially a 2D perovskite-like material.

Figure 4:
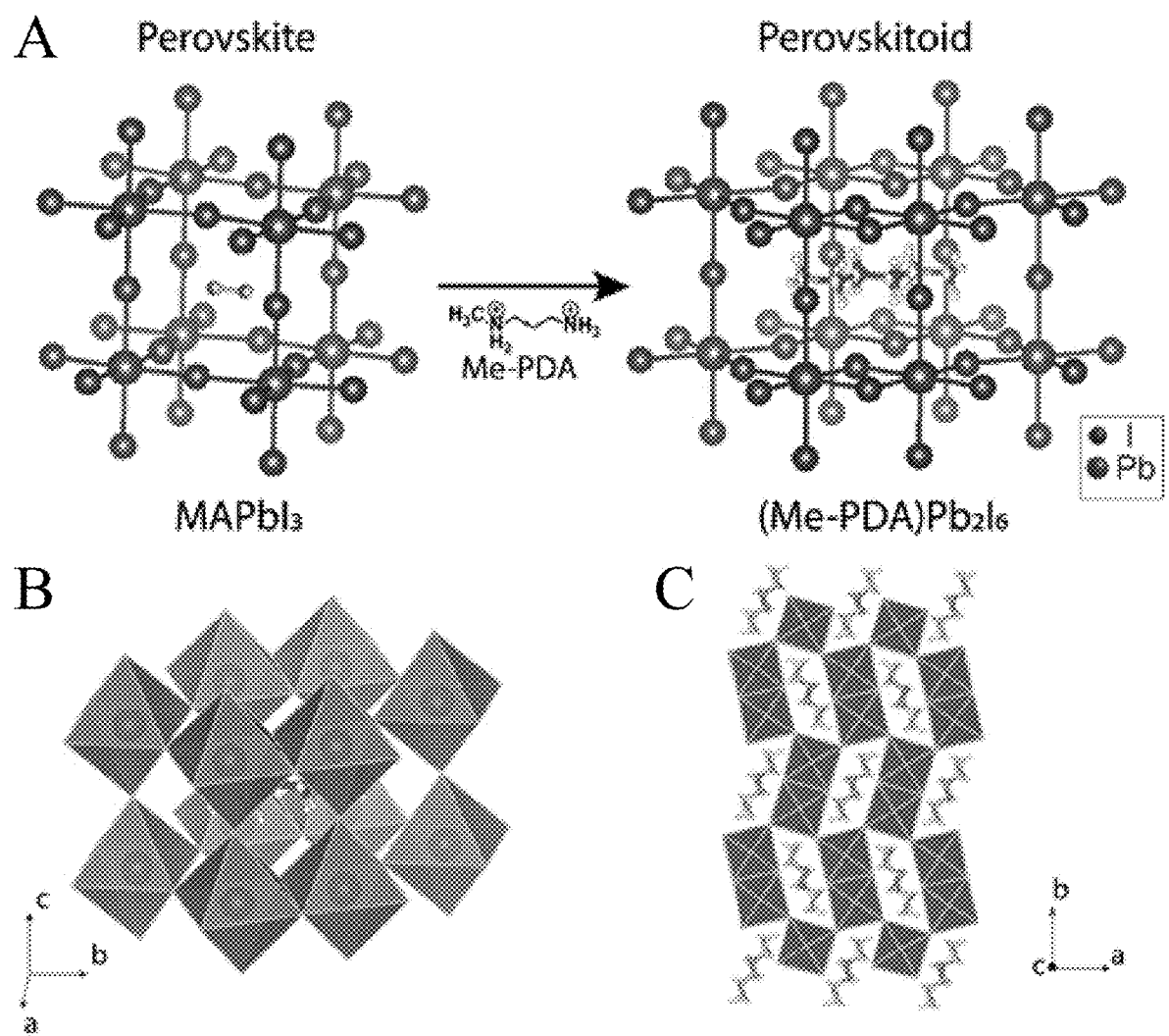
FIG. 4 illustrates a comparison of the crystal structure of (Me-PDA)$Pb_2I_6$, an exemplary perovskitoid material compared to a conventional 3D cubic phase perovskite, $MAPbI_3$, according to some embodiments of the present disclosure; N-methyl-1,3-propane diammonium (Me-PDA).

FIG. 4 illustrates another variation of a 3D non-perovskite structure, referred to herein as a "perovskitoid". This structure does not meet our definition of a perovskite because it is constructed of both edge-sharing and corner-sharing octahedra and has a non-ABX$_3$ stoichiometry; AB$_2$X$_6$. An exemplary perovskitoid is shown, (Me-PDA)Pb$_2$I$_6$, (Me-PDA=N-methyl-1,3-propane diammonium) compared to an exemplary 3D perovskite, MAPbI$_3$, having a conventional 3D perovskite structure. At room temperature, a perovskitoid, AB$_2$X$_6$, may crystallize into a centrosymmetric orthorhombic space-group Pbam. This crystal structure includes 3D corner-sharing octahedra dimers (B$_2$X$_6^{2-}$), which can be derived from the 3D perovskite structure by replacing every octahedron with an edge-sharing octahedra dimer as the basic motif (see Panel A of FIG. 4). The octahedra dimers are formed by edge-sharing two octahedra along the b direction (a=8.9437(4) Å, b=17.4542(6) Å, c=6.4591(3) Å), which are then connected by corner-sharing along a, b, and c directions (see Panels B and C of FIG. 4) to form the 3D framework. In the exemplary perovskitoid shown in FIG. 4, the organic diammonium cations Me-PDA$^{2+}$, i.e., the bulky cations, occupy the rectangular A-cation sites, with longer molecular axis packing along the b direction. The tilting angle of Me-PDA$^{2+}$ cations from b axis exactly follows the tilting angle of the parallel octahedra dimers (see Panel C of FIG. 4). Clearly, without forming the edge-sharing dimers as the basic motif, the bulky organic cation Me-PDA$^{2+}$ cannot be accommodated in the traditional A-site locations of the conventional ABX$_3$ perovskite structure. Other bulky A-cations capable of forming peroskitoids are 3-(aminomethyl)pyridine and 4-(aminomethyl)pyridine.

As described below, any A-cation of a perovskite material, 0D, 1D, and/or 2D perovskite-like material, and/or a perovskitoid material that includes at least one of carbon, nitrogen, and/or hydrogen may be modified to include at least one of a heavier carbon isotope, a heavier nitrogen isotope, and/or deuterium.

In some embodiments of the present disclosure, any of the A-cations 110 listed above may be formed to include at least one of a deuterated hydrogen atom, a carbon isotope atom, and/or a nitrogen isotope atom. An example of a suitable carbon isotope is C-13, according to some embodiments of the present disclosure. An example of a nitrogen isotope is N-15, according to some embodiments of the present disclosure. For example, all of the hydrogen atoms of a non-deuterated formamidinium molecule, NH$_2$CH=NH$_2^+$, may be replaced with deuterium resulting in fully deuterated formamidinium, D$_2$NCD=ND$_2^+$; replacing all of the hydrogen atoms of non-deuterated methylammonium, CH$_3$NH$_3^+$, with deuterium results in fully deuterated methylammonium, CD$_3$ND$_3^+$; replacing all of the hydrogen atoms of non-deuterated ethylammonium, CH$_3$CH$_2$NH$_3^+$, with deuterium results in fully deuterated ethylammonium CD$_3$CD$_2$ND$_3^+$; replacing all of the hydrogen atoms of non-deuterated propylammonium, CH$_3$CH$_2$CH$_2$NH$_3^+$, with deuterium results in fully deuterated propylammonium, CD$_3$CD$_2$CD$_2$ND$_3^+$; replacing all of the hydrogen atoms of non-deuterated butylammonium, CH$_3$CH$_2$CH$_2$CH$_2$NH$_3^+$, results in fully deuterated butylammonium, CD$_3$CD$_2$CD$_2$CD$_2$ND$_3^+$; replacing all of the hydrogen atoms of non-deuterated hydrazinium, H$_2$N—NH$_3^+$, results in fully deuterated hydrazinium, N$_2$D$_5^+$; replacing all of the hydrogen atoms of non-deuterated dimethylammonium H$_3$CNH$_2$CH$_3^+$ results in fully deuterated dimethylammonium, D$_3$CND$_2$CD$_3^+$; and so on. Each of these deuterated A-cations are provide for illustrative purposes and any other organic-containing A-cations suitable for use in a perovskite for a photovoltaic device fall within the scope of the present disclosure.

In the examples above, all of (i.e., 100%) a molecule's hydrogen atoms, with the exception of formamidinium, are replaced with deuterated hydrogen atoms. In some embodiments of the present disclosure, a molecule's hydrogen atoms may be fully or partially replaced with deuterated hydrogen atoms. For example, a deuterated formamidinium molecule may include at least one of fully deuterated formamidinium, D$_2$NCD=ND$_2^+$, and/or partially deuterated formamidinium; D$_2$NCH=ND$_2^+$, DHNCH=ND$_2^+$, H$_2$NCH=ND$_2^+$, H$_2$NCH=NDH$^+$, or DHNCH=NDH$^+$. Although not specifically called out herein, any of the other examples of hydrogen-containing A-cations may be completely deuterated and/or partially deuterated.

In some embodiments of the present disclosure, replacing all of a non-deuterated formamidinium molecule's carbon-12 with carbon-13 results in NH$_2^{13}$CH=NH$_2^+$; replacing all of a non-deuterated methylammonium molecule's carbon-12 with carbon-13 results in $^{13}$CH$_3$NH$_3^+$; replacing all of a non-deuterated ethylammonium molecule's carbon-12 with carbon-13 results in $^{13}$CH$_3^{13}$CH$_2$NH$_3^+$; replacing all of a non-deuterated propylammonium molecule's carbon-12 with carbon-13 results in $^{13}$CH$_3^{13}$CH$_2^{13}$CH$_2$NH$_3^+$; replacing all of a non-deuterated butylammonium molecule's carbon-12 with carbon-13 results in $^{13}$CH$_3^{13}$CH$_2^{13}$CH$_2^{13}$CH$_2$NH$_3^+$; replacing all of a non-deuterated dimethylammonium molecule's carbon-12 with carbon-13 results in H$_3^{13}$CNH$_2^{13}$CH$_3^+$; and so on. As is the case for deuterating a molecule, any of the carbon-containing A-cations described herein may have 100% of its carbon atoms replaced with carbon-13 atoms and/or any of the carbon atoms of the carbon-containing A-cations described herein may be partially replaced with carbon-13 atoms.

Similarly, replacing all of a non-deuterated formamidinium molecule's nitrogen-14 with nitrogen-15 results in $^{15}$NH$_2$CH=$^{15}$NH$_2^+$; replacing all of a non-deuterated methylammonium molecule's nitrogen-14 with nitrogen-15 results in CH$_3^{15}$NH$_3^+$; replacing all of a non-deuterated ethylammonium molecule's nitrogen-14 with nitrogen-15 results in CH$_3$CH$_2^{15}$NH$_3^+$; replacing all of a non-deuterated propylammonium molecule's nitrogen-14 with nitrogen-15 results in CH$_3$CH$_2$CH$_2^{15}$NH$_3^+$; replacing all of a non-deuterated butylammonium molecule's nitrogen-14 with nitrogen-15 results in CH$_3$CH$_2$CH$_2$CH$_2^{15}$NH$_3^+$; replacing all of a non-deuterated dimethylammonium molecule's nitrogen-14 with nitrogen-15 results in H$_3$C$^{15}$NH$_2$CH$_3^+$; replacing all of a non-deuterated hydrazinium molecule's nitrogen-14 with nitrogen-15 results in H$_2^{15}$N—$^{15}$NH$_3^+$; and so on. As is the case for deuterating a molecule, any of the nitrogen-containing A-cations described herein may have 100% of its nitrogen atoms replaced with nitrogen-15 atoms and/or any of the nitrogen atoms of the nitrogen-containing A-cations described herein may be partially replaced with nitrogen-15 atoms.

Thus, as shown by the examples above, in some embodiments of the present disclosure, a perovskite may include an A-cation 110 that includes hydrogen, carbon, and nitrogen, wherein at least one of these elements is in the form of a heavier isotope (i.e., having additional neutrons).

Examples of metal B-cations 120 include, for example, lead, tin, germanium, and or any other 2+ valence state metal that can charge-balance the perovskite 100. Further examples include transition metals in the 2+ state such as Mn, Mg, Zn, Cd, and/or lanthanides such as Eu. B-cations may also include elements in the 3+ valence state, as described below, including for example, Bi, La, and/or Y. Examples for X-anions 130 include halogens: e.g., fluorine, chlorine, bromine, iodine and/or astatine. In some cases, the perovskite halide may include more than one X-anion 130, for example pairs of halogens; chlorine and iodine, bromine and iodine, and/or any other suitable pairing of halogens. In other cases, the perovskite 100 may include two or more halogens of fluorine, chlorine, bromine, iodine, and/or astatine.

Thus, the A-cation 110, the B-cation 120, and X-anion 130 may be selected within the general formula of $ABX_3$ to produce a wide variety of perovskites 100, including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. Thus, a perovskite 100 may have more than one halogen element, where the various halogen elements are present in non-integer quantities; e.g., x is not equal to 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure. As described herein, the A-cation 110 of a perovskite 100, may include one or more A-cations, for example, one or more of cesium, FA, MA, etc. Similarly, the B-cation 120 of a perovskite 100, may include one or more B-cations, for example, one or more of lead, tin, germanium, etc. Similarly, the X-anion 130 of a perovskite 100 may include one or more anions, for example, one or more halogens (e.g., at least one of I, Br, Cl, and/or F), thiocyanate, and/or sulfur. Any combination is possible provided that the charges balance.

For example, a perovskite having the basic crystal structure illustrated in FIGS. 1A-1C, in at least one of a cubic, orthorhombic, and/or tetragonal structure, may have other compositions resulting from the combination of the cations having various valence states in addition to the 2+ state and/or 1+ state described above for lead and alkyl ammonium cations; e.g., compositions other than $AB^{2+}X_3$ (where A is one or more cations, or for a mixed perovskite where A is two or more cations). Thus, the methods described herein may be utilized to create novel mixed cation materials having the composition of a double perovskite (elpasolites), $A_2B^{1+}B^{3+}X_6$, with an example of such a composition being $Cs_2BiAgCl_6$ and $Cs_2CuBiI_6$. Another example of a composition covered within the scope of the present disclosure is described by $A_2B^{4+}X_6$, for example $Cs_2PbI_6$ and $Cs_2SnI_6$. Yet another example is described by $A_3B_2^{3+}X_9$, for example $Cs_3Sb_2I_9$. For each of these examples, A is one or more cations, or for a mixed perovskite, A is two or more cations. As described above, any A-cation of a perovskite that includes at least one of carbon, nitrogen, and/or hydrogen may be modified to include at least one of a heavier carbon isotope, a heavier nitrogen isotope, and/or deuterium.

Figure 5A:
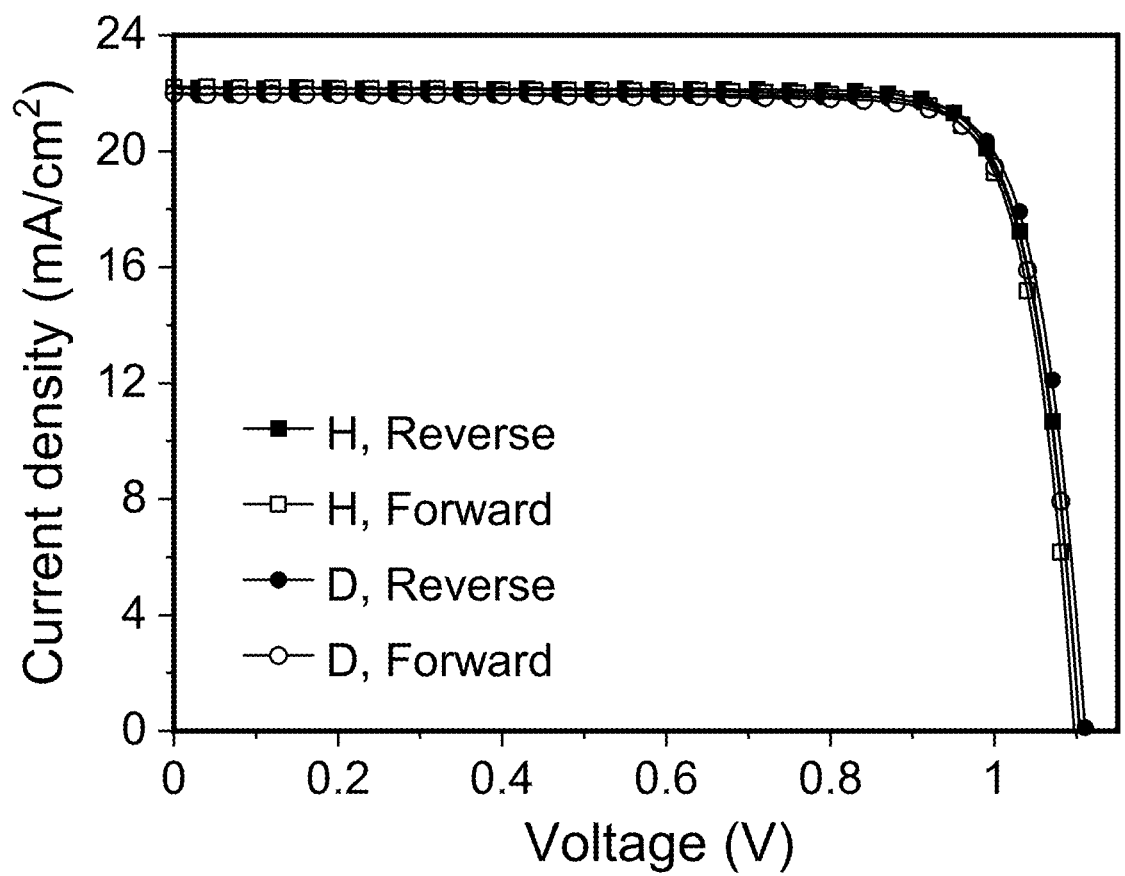
FIGS. 5A and 5B illustrate preliminary results showing the effect of deuteration of FAI (denoted by D-FAI) on the (FIG. 5A) J-V characteristics with both reverse (R) and forward (F) scan directions and (FIG. 5B) thermal stability at 85° C. in nitrogen, using a standard PSC configuration (ITO/PTAA/perovskite/$C_{60}$ BCP/Ag), according to some embodiments of the present disclosure. The control device used the standard H-based FAI (H-FAI). The exemplary perovskite composition tested was $Cs_{0.05}FA_{0.8}MA_{0.15}PbI_{2.55}Br_{0.45}$.
Figure 5B:
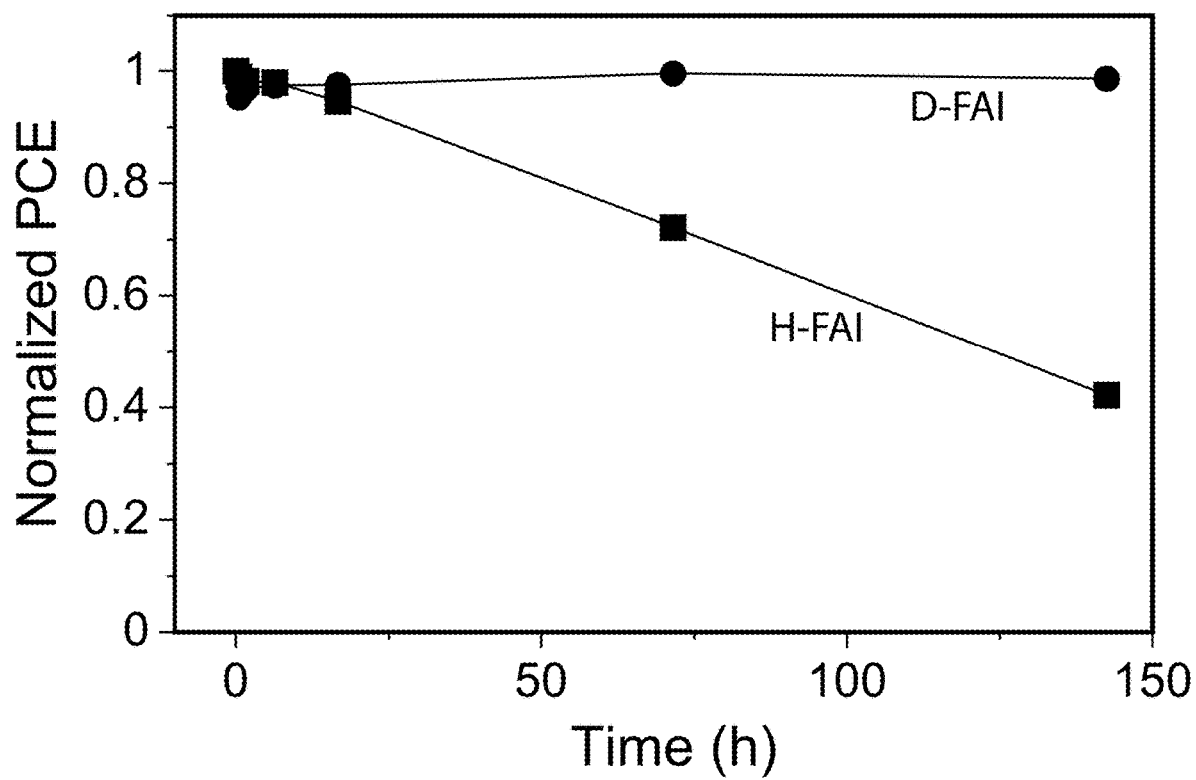

Deuterated FAI (referred to as D-FAI) was incorporated into a first perovskite composition having the following stoichiometry: $Cs_{0.05}FA_{0.8}MA_{0.15}PbI_{2.55}Br_{0.45}$, which was then used to fabricate a solar cell having the following stack architecture: glass/ITO/PTAA/perovskite/C60/BCP/Ag. Compared to the H-based FAI (H-FAI) counterpart, the D-FAI-based PSCs showed essentially the same current density-voltage (J-V) characteristics with PCE>20% and minimum hysteresis, as shown in FIG. 5A). A significant difference was observed in the preliminary thermal stability test at 85° C. in nitrogen. After heating for about 150 hours, the D-FAI PSC showed less than 2% degradation in its PCE whereas the H-FAI PSC exhibited about a 60% degradation in its PCE, as shown in FIG. 5B). These preliminary results, especially the amazing thermal stability improvement, agree well with the hypothesis described above. Therefore, the same proposed approach may be applied to various relevant perovskites where FA, MA, and/or any other hydrogen-, nitrogen-, and/or hydrogen-containing A-cations are used. Table 1 summarizes the photovoltaic parameters for the device whose performance is illustrated in FIGS. 5A and 5B.

TABLE 1

Photovoltaic parameters of $Cs_{0.05}FA_{0.80}MA_{0.15}PbI_{2.55}Br_{0.45}$-based perovskite solar cells with different types of FAI (as indicated). The corresponding J-V curves are shown in FIG. 5A.

| Type/scan direction | $V_{oc}$ (V) | $J_{sc}$ (mA/cm$^2$) | FF | PCE (%) |
|---|---|---|---|---|
| H-FAI, Reverse | 1.10 | 22.19 | 83.1 | 20.28 |
| H-FAI, Forward | 1.10 | 22.21 | 82.2 | 20.08 |
| D-FAI, Reverse | 1.10 | 21.97 | 83.3 | 20.31 |
| D-FAI, Forward | 1.10 | 22.00 | 82.9 | 20.06 |

Figure 6:
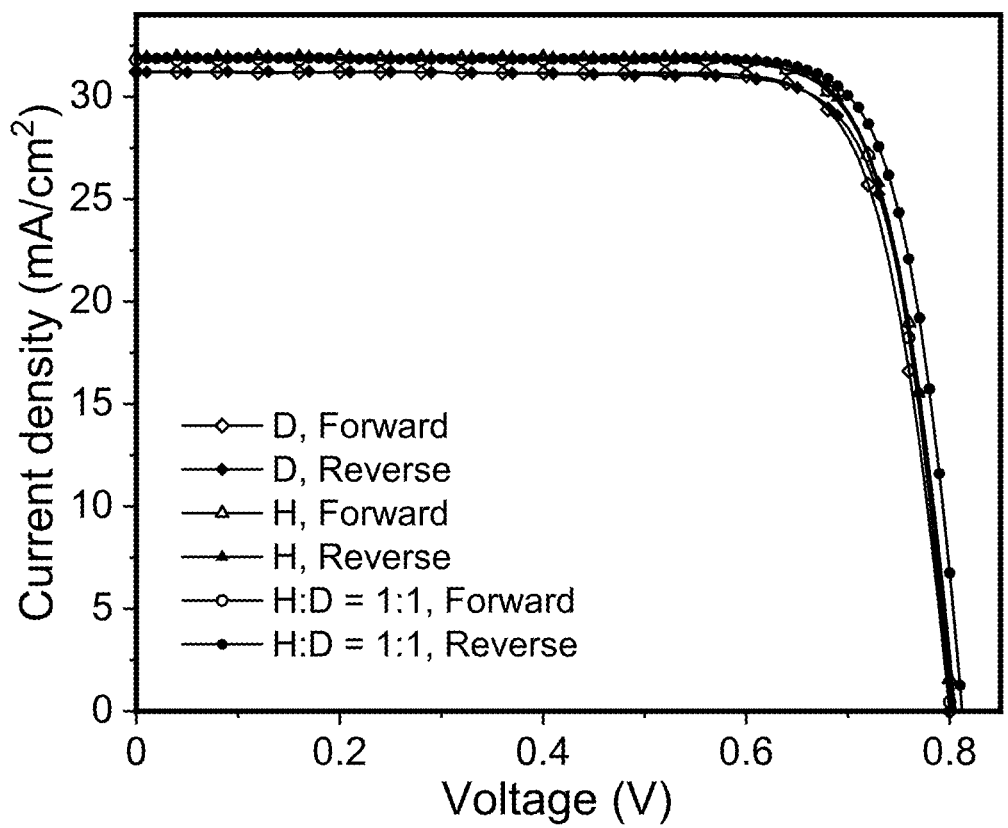
FIG. 6 illustrates J-V characteristics of $Cs_{0.25}FA_{0.75}Sn_{0.5}Pb_{0.5}I_3$-based perovskite solar cells with different types of FAI (as indicated) with both reverse and forward scan directions under simulated one-sun illumination, according to some embodiments of the present disclosure. The device stack is glass/ITO/PEDOT:PSS/perovskite/$C_{60}$/BCP/Ag.
Figure 7:
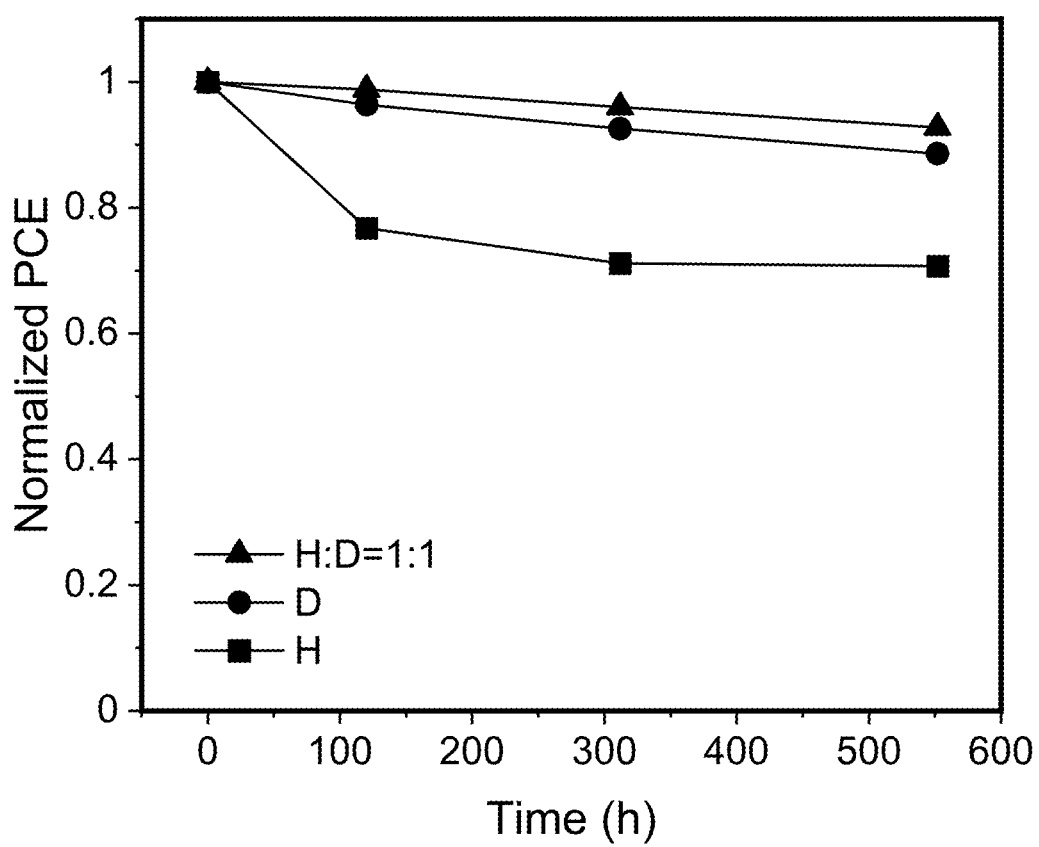
FIG. 7 illustrates the operational device stability of an encapsulated $Cs_{0.25}FA_{0.75}Sn_{0.5}Pb_{0.5}I_3$-based perovskite solar cells with different types of FAI (as indicated) under continuous light illumination at about 50° C. in ambient air, according to some embodiments of the present disclosure. The relative humidity is about 50%. The perovskite solar cells were biased near the maximum power point during illumination.

Deuterated FAI was incorporated into a second perovskite composition having the following stoichiometry: $Cs_{0.25}FA_{0.75}Sn_{0.5}Pb_{0.5}I_3$, which was then used to fabricate a solar cell having the following stack architecture: glass/ITO/PEDOT:PSS/perovskite/C60/BCP/Ag. FIG. 6 illustrates the J-V characteristics of $Cs_{0.25}FA_{0.75}Sn_{0.5}Pb_{0.5}I_3$-based perovskite solar cells. The corresponding photovoltaic parameters are listed in detail in Table 2. Three types of FAI compositions were compared: pure H-based FAI, pure D-based FAI, and FAI based on H:D=1:1. It is evident that using D to replace partially or completely H in FAI does not have significant negative impact on the device efficiency although the device based on H:D=1:1 showed slightly improved device efficiency. FIG. 7 shows that the use of D to replace partially or completely H in FAI can significantly enhance device operational stability. For the stability test, these cells were encapsulated and biased near the maximum power point under continuous light illumination at about 50° C. in ambient air with a relative humidity of about 50%.

TABLE 2

Photovoltaic parameters of $Cs_{0.25}FA_{0.75}Sn_{0.5}Pb_{0.5}I_3$-based perovskite solar cells with different types of FAI (as indicated). The corresponding J-V curves are shown in FIG. 6.

| Type/scan direction | $V_{oc}$ (V) | $J_{sc}$ (mA/cm$^2$) | FF | PCE (%) |
|---|---|---|---|---|
| H-FAI, Forward | 0.803 | 31.958 | 0.802 | 20.581 |
| H-FAI, Reverse | 0.805 | 31.971 | 0.804 | 20.692 |
| D-FAI, Forward | 0.8 | 31.205 | 0.801 | 19.996 |
| D-FAI, Reverse | 0.805 | 31.232 | 0.8 | 20.113 |
| H:D = 1:1, FAI, Forward | 0.801 | 31.803 | 0.809 | 20.609 |
| H:D = 1:1, FAI, Reverse | 0.812 | 31.887 | 0.813 | 21.050 |

FTIR results: Fourier transform infrared (FTIR) spectroscopy was conducted to characterize the change of functional groups in perovskite thin films under accelerated aging condition using oxygen plasma. (L=low energy; M=medium energy; H=high energy). The perovskite compositions for FTIR test including the following three types of $(FASnI_3)_{0.6}(MAPbI_3)_{0.4}$ with different deuterations on MA and FA as indicated:
 $(CH(NH_2)_2SnI_3)_{0.6}(CH_3NH_3PbI_3)_{0.4}$ (hydrogen-based MA denoted as: H-based),
 $0.5[(CH(NH_2)_2SnI_3)_{0.6}(CH_3NH_3PbI_3)_{0.4}]0.5[(CH(ND_2)_2SnI_3)_{0.6}(CD_3ND_3PbI_3)_{0.4}]$ (deuterated FA and MA denoted as: 0.5$H_{0.5}$D-based)

(CH(ND$_2$)$_2$SnI$_3$)$_{0.6}$(CD$_3$ND$_3$PbI$_3$)$_{0.4}$ (deuterated MA denoted as: D-based)

Figure 8:
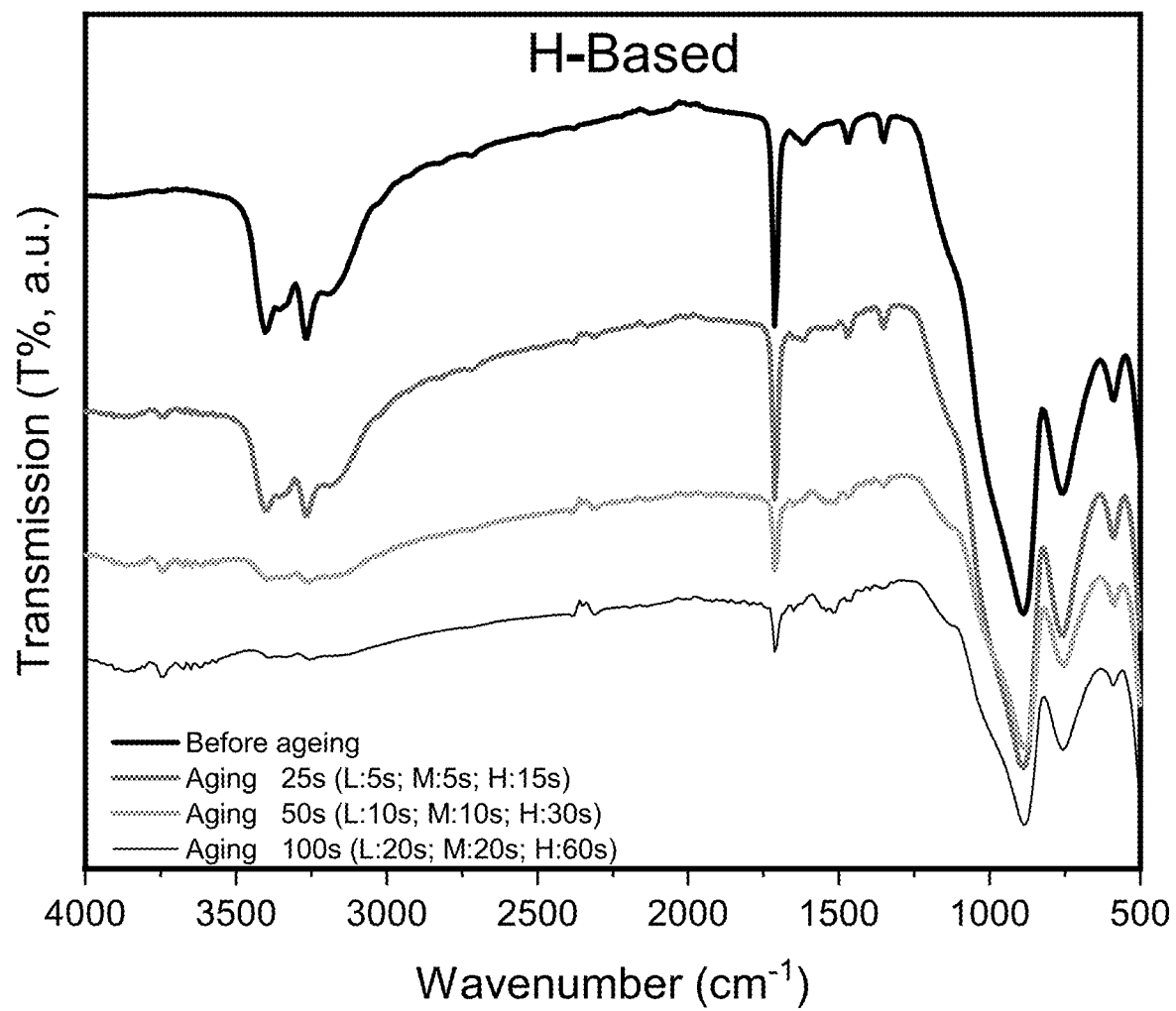
FIG. 8 illustrates FTIR spectra of H-based $(FASnI_3)_{0.6}(MAPbI_3)_{0.4}$ perovskite films before and after oxygen plasma treatment for different aging durations as indicated, according to some embodiments of the present disclosure.
Figure 9:
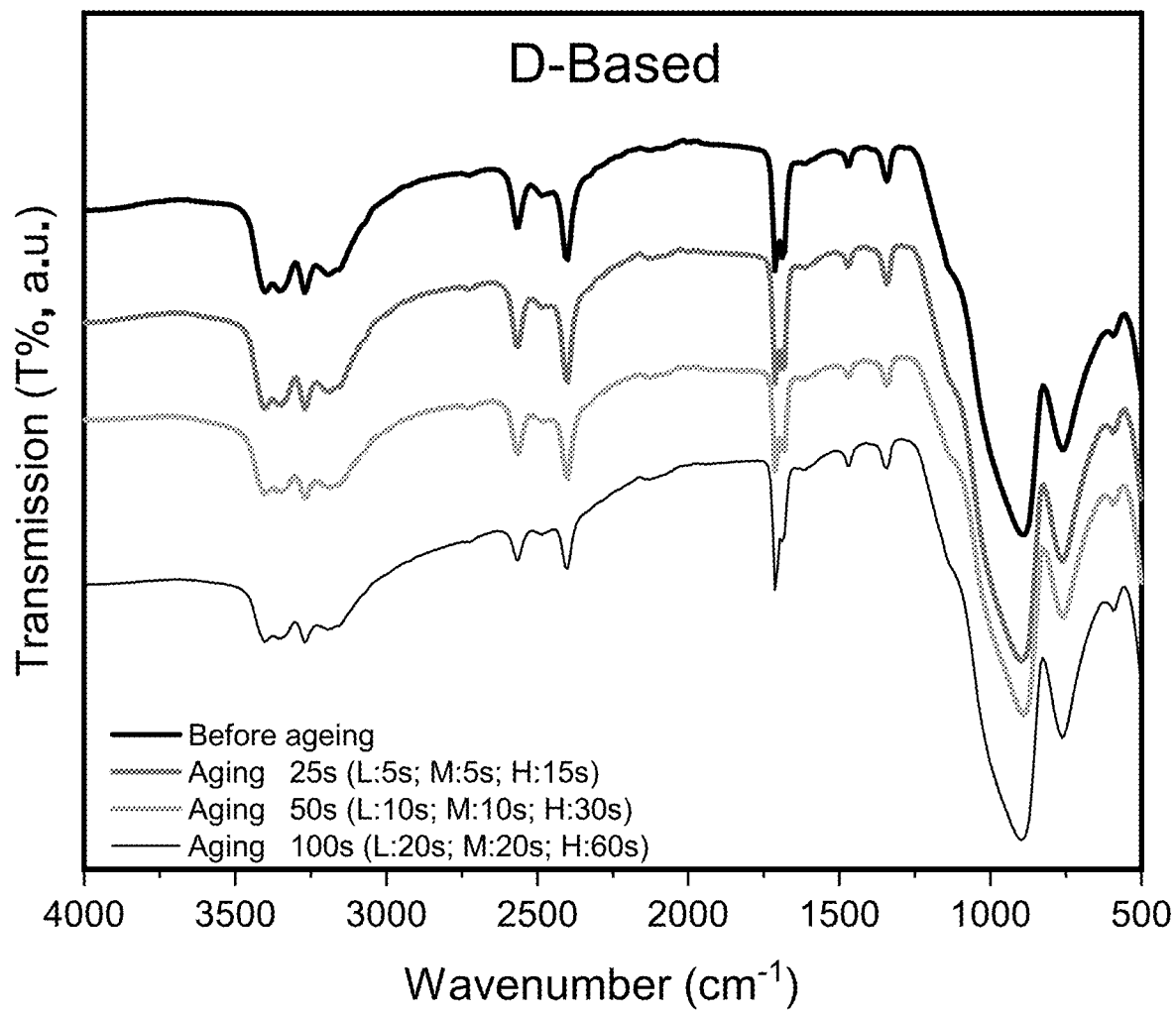
FIG. 9 illustrates FTIR spectra of D-based $(FASnI_3)_{0.6}(MAPbI_3)_{0.4}$ perovskite films before and after oxygen plasma treatment for different aging durations, according to some embodiments of the present disclosure.

As the oxygen plasma treatment time was increased, H-based FTIR spectra (see FIG. 8) show attenuated intensities for peaks at: v≈3402 cm$^{-1}$ (N—H stretching), v≈3271 cm$^{-1}$ (C—H stretching), v≈1712 cm$^{-1}$ (C=N stretching), v≈1612 cm$^{-1}$ (N—H bending), and v≈1470/1350 cm$^{-1}$ (C—H bending), indicating the oxidation of these functional groups, namely, the insertion of oxygen atoms, which is further identified by the corresponding growth of two new peaks emerging at v≈3749 cm$^{-1}$ (free O—H stretching) and v≈1519 cm$^{-1}$ (N—O stretching). After 100 seconds of oxygen plasma treatment, only the bonds of O—H stretching, N—O stretching and part of C=N stretching were detectable. In remarkable contrast, as shown in FIG. 9, almost no change is observed in the FTIR spectra resulting from the D-based samples even after 100 seconds of plasma treatment, indicating a significantly enhanced robustness of N-D or C-D bonds, which is consistent with the two-fold heavier D mass compared to the mass of H. This increased mass that impedes the deuterated hydrogen's motion to accommodate the oxygen insertion.

Figure 10:
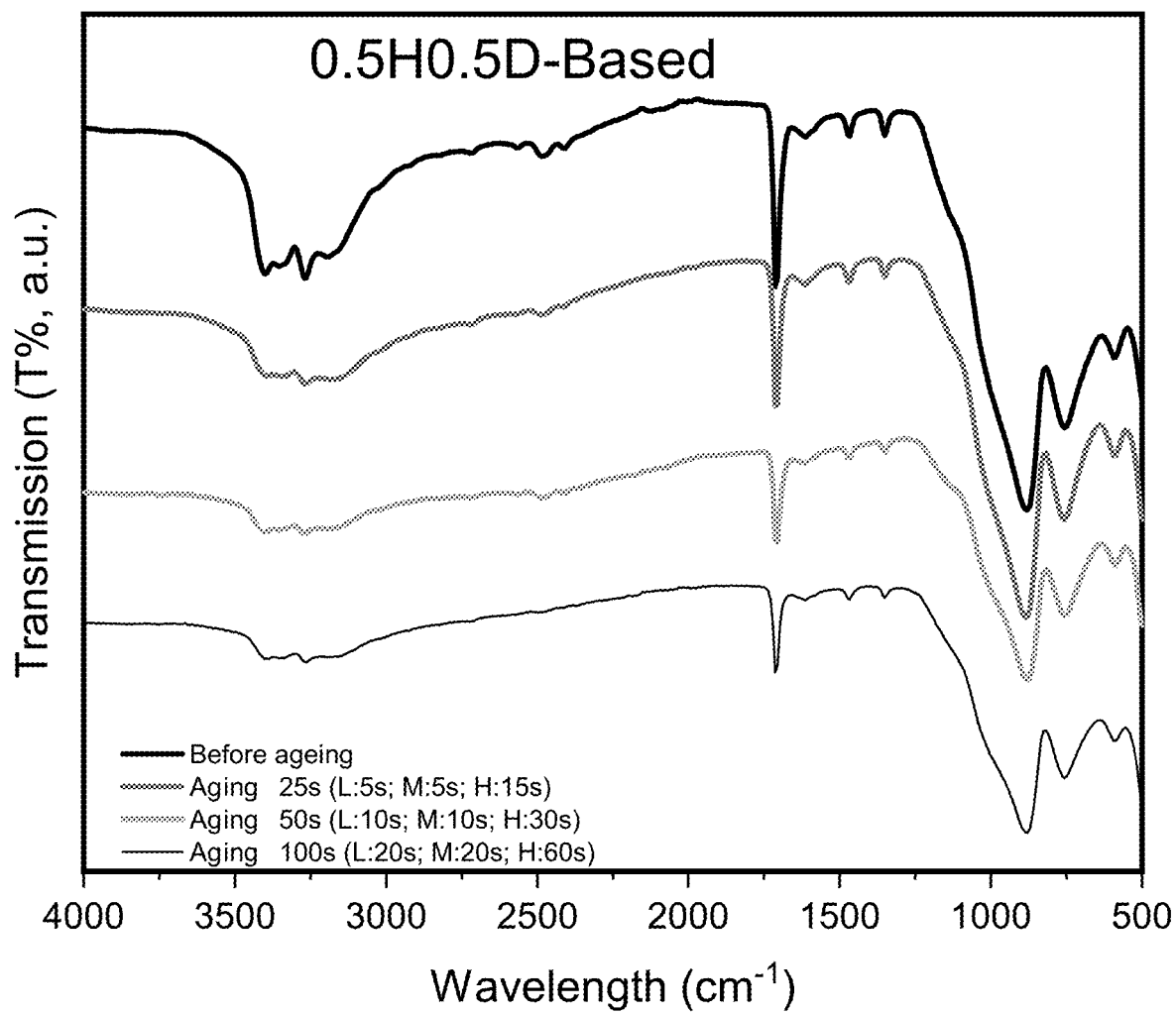
FIG. 10 illustrates FTIR spectra of 0.5H/0.5D-based $(FASnI_3)_{0.6}(MAPbI_3)_{0.4}$ perovskite films before and after oxygen plasma treatment for different aging durations, according to some embodiments of the present disclosure.

FIG. 10 illustrates the results for oxygen plasma treated 0.5H/0.5D-based samples, where this composition offers a midpoint data set between the H-based and D-based samples described above. Explicitly, C—H stretching, N—H stretching, C=N stretching, N—H bending, and C—H bending were slightly attenuated in comparison to those of H-based samples. Correspondingly, the new peak corresponding to O—H stretching is observed at 3745 cm$^{-1}$, much weaker than that of pure H-based sample, and the peak corresponding to N—O stretching is hardly detected, indicating the diffusion of oxygen to the film was inhibited by the presence of the heavier deuterium atoms positioned in the perovskite structure.

EXPERIMENTAL

Synthesis of deuterated CH(ND$_2$)$_2$I (D-FAI). CH(NH$_2$)$_2$I (FAI, Greatcell Solar Materials Pty Ltd.) was dissolved in excessive deuterium oxide (Sigma Aldrich, 99.9 atom %) at a molar ratio of 1:40 under stirring, followed by heating the solution to 90° C. for 2 hours under argon (Ar). The liquid was then evaporated at 70° C. under flow of Ar to dry off. This process was repeated three times to ensure complete substitution of ammonium hydrogen by deuterium to yield the high purity of D-FAI. At last, the white solid was collected and moved to the vacuum oven at 60° C. overnight for further drying. In principle, most of D$_2$O can be recollected by reflux for future scaled-up synthesis.

Synthesis of deuterated CD$_3$ND$_3$I (D-MAI). First, CD$_3$NH$_2$ gas (Sigma Aldrich, 99.9 atom %) was slowly reacted with equimolar amount of HI solution (Sigma Aldrich, 57 wt % in water) in a round-bottom flask soaked into an ice bath, and then the solvent of this solution was dried off by rotary evaporation at 60° C. The collected solid of CD$_3$NH$_3$I with HI residual was further washed by anhydrous ethyl ether (Fisher Chemical) under vacuum filtration, followed by drying the white solid in the vacuum oven at 60° C. overnight. Next, the above collected CD$_3$NH$_3$I was dissolved in excessive deuterium oxide at a molar ratio of 1:40 with stirring, followed by heating the solution to 90° C. for 2 hours under Ar and then being evaporated at 70° C. under flowing Ar to dry off the solvent. This process was repeated three times to ensure complete substitution of N—H by N-D to yield the high purity of D-MAI. At last, the white solid was collected and transferred to the vacuum oven at 60° C. overnight for further drying.

Perovskite precursor preparation. All the perovskite solution and film depositions were conducted in a Na glovebox with O$_2$ level <1 ppm, H$_2$O<1 ppm. For Cs$_{0.25}$FA$_{0.75}$Sn$_{0.5}$Pb$_{0.5}$I$_3$ perovskite solar cells precursor, 258 mg H-FAI (pure hydrogenated FAI, Greatcell, Australia), 461 mg PbI$_2$ (anhydrous, Sigma-Aldrich, USA), 130 mg CsI (anhydrous, Sigma-Aldrich, USA), 16 mg SnF$_2$ (Sigma-Aldrich, USA) and 338.7 mg SnI$_2$ (anhydrous, bead, Sigma-Aldrich, USA) in 800 mL dimethylformamide (DMF) (anhydrous, Sigma-Aldrich, USA) and 200 mL DMSO (anhydrous, Sigma-Aldrich). For preparing deuterated FAI based Cs$_{0.25}$FA$_{0.75}$Sn$_{0.5}$Pb$_{0.5}$I$_3$ perovskite, 264 mg D-FAI was used instead of 258 mg H-FAI. In the case of 50% deuterated FAI based Cs$_{0.25}$FA$_{0.75}$Sn$_{0.5}$Pb$_{0.5}$I$_3$ perovskite, 129 mg H-FAI and 132 mg D-FAI were used instead of 258 mg H-FAI in the precursor. For (FASnI$_3$)$_{0.6}$(MAPbI$_3$)$_{0.4}$ precursor, 103.2 mg FAI, 223.2 mg SnI$_2$, 9.36 mg SnF$_2$, 63.6 mg MAI, 184.4 mg PbI$_2$ were mixed in 500 µl DMF/DMSO (V/V 4:1). For preparing deuterated FAI and deuterated MAI based (FASnI$_3$)$_{0.6}$(MAPbI$_3$)$_{0.4}$ perovskite, 105.6 mg D-FAI and 66 mg D-MAI were used instead of H-FAI and H-MAI. In the case of 50% deuterated FAI and 50% deuterated MAI based (FASnI$_3$)$_{0.6}$(MAPbI$_3$)$_{0.4}$, the above H-FAI and H-MAI based (FASnI$_3$)$_{0.6}$(MAPbI$_3$)$_{0.4}$ and D-FAI and D-MAI based (FASnI$_3$)$_{0.6}$(MAPbI$_3$)$_{0.4}$ precursors were mixed with the ratio of 1:1. For Cs$_{0.05}$FA$_{0.8}$MA$_{0.15}$PbI$_{2.55}$Br$_{0.45}$ perovskite solar cells precursor, 15.54 mg CsI, 165.12 mg H-FAI, 20.16 mg MABr, 66.1 mg PbBr$_2$, 470.22 mg PbI$_2$ in anhydrous DMF: DMSO (800 µL: 200 µL) co-solvent. In the case of deuterated FAI based Cs$_{0.05}$FA$_{0.8}$MA$_{0.15}$PbI$_{2.55}$Br$_{0.45}$, 169 mg D-FAI was used instead of H-FAI. In the case of 50% deuterated FAI based Cs$_{0.05}$FA$_{0.8}$MA$_{0.15}$PbI$_{2.55}$Br$_{0.45}$, 82.56 mg H-FAI and 84.5 mg D-FAI were used instead of H-FAI.

Device fabrication: Pb—Sn mixed narrow bandgap perovskite solar cells. The pre-patterned ITO substrates were sequentially cleaned by ultrasonication in acetone and isopropanol three times. The ITO/glass substrates were then dried with a Na gun and UV-ozone treated for 15 min. The PEDOT:PSS (CLEVIOS P VP Al 4083, filtered through a 0.45 mm nylon filter) were spin-coated onto ITO substrates at 3,000 rpm for 30 s and annealed on a hot plate at 150° C. for 30 min in air. After that, the substrates were transferred to a nitrogen glovebox (02 level <1 ppm, H$_2$O<1 ppm) to prepare the narrow bandgap perovskite layer. The Cs$_{0.25}$FA$_{0.75}$Sn$_{0.5}$Pb$_{0.5}$I$_3$ perovskite films were deposited by spin-coating the solution as described above at 5,000 rpm for 40 s. A Na stream was blown over the spinning substrate for 20 s during the spinning procedure to assist the formation of perovskite film. Films were then annealed at 120° C. for 10 min. The (FASnI$_3$)$_{0.6}$(MAPPI$_3$)$_{0.4}$ perovskite films were spin-coated onto the ITO/PEDOT:PSS substrates at 5000 rpm for 30 s and 350 µl toluene was dripped onto the spinning substrate at 10 s after the starting of the spin coating. The resulting perovskite films were then thermally annealed at 100° C. for 10 min. Finally, C60 (30 nm)/BCP (6 nm)/Ag (100 nm) were sequentially deposited by thermal evaporator to complete the perovskite solar cells.

Device fabrication: Cs$_{0.05}$FA$_{0.8}$MA$_{0.15}$PH$_{2.55}$Br$_{0.45}$ perovskite solar cells. The pre-patterned ITO substrates (15Ω sq-1) were sequentially ultra-sonic cleaned using acetone and 2-propanol. The ITO substrates were then transferred into the nitrogen filled glovebox. 2 mg/ml poly (triaryl amine) (PTAA) solution was spin coated onto the ITO substrates at 5000 rpm for 30 s and annealed at 100° C. for 10 min. The $Cs_{0.05}FA_{0.8}MA_{0.15}PbI_{2.55}Br_{0.45}$ perovskite precursor was spin-coated onto the PTAA/ITO substrate at 5000 rpm for 30 s. After 10 s of the starting of the spin coating, 350 lit diethyl ether (DEE) was dropped onto the substrate. The resulting perovskite films were then annealed at 100° C. for 10 min. After the deposition of the perovskite film, C60 (30 nm)/BCP (6 nm)/Ag (100 nm) were sequentially deposited by thermal evaporation.

Characterization. Devices were tested using a Newport Oriel Sol 3A solar simulator with a Xenon lamp in a nitrogen filled glovebox. The intensity of the solar simulator was calibrated to 100 mW/cm² AM 1.5G. The light current density-voltage (J-V) characteristic were taken with the step size of 10-30 mV and step delay of 10 ms, unless otherwise stated. The device area was 0.1 cm² and was masked with a metal aperture to define an active area of 0.058 cm².

Oxygen-plasma oxidation of perovskite films. The accelerated oxidation of different perovskite films were conducted by a Plasma Cleaner (PDC-32G, Harrick Plasma). This Plasma Cleaner includes three gears: low energy, medium energy, and high energy.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A composition comprising:
   at least one of a perovskite material or a perovskite-like material having a structure comprising a first cation (A), a second cation (B), and an anion (X), wherein:
   the first cation comprises at least one of formamidinium (FA), ethylammonium, propylammonium, butylammonium, hydrazinium, acetylammonium, dimethylammonium, imidazolium, guanidinium, benzylammonium, or phenethylammonium, and
   at least a first portion of the first cation is deuterated.

2. The composition of claim 1, wherein the first portion includes deuterated FA.

3. The composition of claim 2, wherein a second portion of the first cation includes at least one of carbon-13 or nitrogen-15.

4. The composition of claim 1, wherein the structure comprises at least one of $ABX_3$, $A_2BX_6$, $A_2BX_4$, $ABX_4$, or $A_3B_2X_9$.

5. The composition of claim 2, wherein:
   the first cation comprises FA and methylammonium (MA),
   the second cation comprises at least one of lead or tin,
   the anion comprises a halide, and
   the MA is not deuterated.

6. The composition of claim 5, wherein the perovskite further comprises an inorganic A-cation.

7. The composition of claim 6, wherein the inorganic A-cation comprises cesium.

8. The composition of claim 7, wherein:
   the structure comprises $Cs_{(1-x-y)}FA_xMA_yPb_{(1-a)}Sn_aI_{(3-z)}Br$, $x+y \neq 1.0$ $\leq x \leq 1.0 \leq y \leq 1.0 \leq a \leq 1$, and $0 \leq z \leq 3$.

9. The composition of claim 8, wherein the structure is at least one of $Cs_{0.05}FA_{0.8}MA_{0.15}PbI_{2.55}Br_{0.45}$ or $Cs_{0.25}FA_{0.75}Sn_{0.5}Pb_{0.5}I_3$.

10. A method comprising:
    synthesizing a precursor comprising a deuterated cation;
    preparing a solution comprising the precursor;
    depositing the solution onto a surface to form a liquid film of the solution on the surface; and
    treating the film, wherein:
    the treating converts the liquid film to a material comprising at least one of a perovskite material or a perovskite-like material having a structure comprising a first cation (A), a second cation (B), and an anion (X), and
    the deuterated cation comprises at least one of formamidinium (FA), ethylammonium, propylammonium, butylammonium, hydrazinium, acetylammonium, dimethylammonium, imidazolium, guanidinium, benzylammonium, or phenethylammonium.

11. The composition of claim 5, wherein the structure is $FA_{0.6}MA_{0.4}Pb_{0.4}Sn_{0.6}I_3$.

12. The composition of claim 2, wherein the deuterated first cation comprises at least one of $D_2NCH=ND_2^+$, $DHNCH=ND_2^+$, $H_2NCH=ND_2^+$, $H_2NCH=NDH^+$, or $DHNCH=NDH^+$.

* * * * *